United States Patent [19]
Jackson

[11] Patent Number: 4,760,377
[45] Date of Patent: Jul. 26, 1988

[54] DECOMPACTION OF STORED DATA IN AUTOMATIC TEST SYSTEMS

[75] Inventor: Philip C. Jackson, Mahway, N.J.

[73] Assignee: Giordano Associates, Inc., Sparta, N.J.

[21] Appl. No.: 717,339

[22] Filed: Mar. 29, 1985

Related U.S. Application Data

[63] Continuation-in-part of Ser. No. 55,287, Nov. 25, 1983, Pat. No. 4,656,632.

[51] Int. Cl.$^4$ .............................................. H03M 7/30
[52] U.S. Cl. ............................. 340/347 DD; 562/457; 564/341; 564/440; 564/500; 564/501; 564/503; 564/509; 564/510
[58] Field of Search ................ 340/347 DD; 358/260, 358/261; 235/310

[56] References Cited

U.S. PATENT DOCUMENTS

| | | | |
|---|---|---|---|
| 3,394,352 | 7/1968 | Wernikoff | 358/261 |
| 3,832,535 | 8/1974 | DeVito | |
| 3,854,125 | 10/1974 | Ehling et al. | |
| 3,922,537 | 11/1975 | Jackson | |
| 3,930,232 | 12/1975 | Wallach | 235/310 |
| 4,509,038 | 4/1985 | Hirano | 235/310 |

OTHER PUBLICATIONS

Research & Development Technical Report CECOM--TR-82-H060-Universal Pin Electronics Compaction/Decompaction Technique ® Mar. 1984 by Philip Jackson et al.
Research and Development Technical Report CECOM-TR-82-H060-F Universal Pin Electronics Compaction/Decompaction Technique Mar. 1984.
Contract No. DAAK80-C-0146, pp. 1 and 5-7, Aug 10, 1981 pp. 18-20 Containing Article Entitled "Pin Electronics Architecture", Circa 1981.
First 3 pages, pages A-1, A-2, A-3, B-1, b-2 and C-1 through C-6 of Solicitation No. DAAB07-83-R-H038 Dated Feb. 3, 1983.
U.S. Army Communciations-Electronics Command (Fort Monmouth, New Jersey07703) Report No. CECOM-81-0146-F, Titled "Universal Pin Electronics", Dated Sep. 1982.
Interim Report "Pin Electronics Decompaction Module", Dated Mar. 31, 1983 for Contract No. DAAB0-7-82-CH060-1.
"Evolutionary Trends in Pin Electronics", Dated Jun. 1979 Published by the IEEE (CH1488-6/79/00-00-0018500.75).

*Primary Examiner*—Charles D. Miller
*Attorney, Agent, or Firm*—Amster, Rothstein & Ebenstein

[57] ABSTRACT

Disclosed is a decompaction system for reading compacted paralled data from a memory and providing in real time uncompacted serial data therefrom. The decompaction system is especially suited to be utilized in pin electronics automatic test equipment for real time testing of units such as integrated circuits, circuit boards, etc. The decompaction system includes a separate channel for each pin of the unit under test (UUT) and is capable of decoding a number of types of compacted parallel data and providing serail data to each pin of the UUT in the most prevalently used test patterns. The data is compacted by software algorithms according to these patterns, stored in a memory and retrieved and decoded by the decompaction system during real-time testing of the UUT. In a specific embodiment, compacted parallel data is stored in 16-bit words in a separate memory for each channel, and is decompacted into serial data sequences of from 8 to 4096 bits per channel for each access of the respective memory. Thus, supplying of serial test data to the UUT is enhanced over the access time of the memory by as much as 256 times. In addition, it is not necessary to interrupt testing to refill the memory since sufficient compacted data can be stored in the memory to complete testing of the UUT.

35 Claims, 9 Drawing Sheets

Fig. 9.

| Bit | Code | | | |
|---|---|---|---|---|
| | Code A | Code B | Code C | Code D |
| 1<br>2 | Code Word Identifier Field | | | |
| 3<br>4 | Word Length Field | Basic Data Pattern Field | First Basic Data Bit Field | Sequence Repeat Field |
| 5 | Word Number Sequence Field | | | |
| 6<br>7<br>8 | Extended Data Bit Field | Basic Data Length Field | Pattern Repeat Field | Word Number Field |
| 9<br>10<br>11<br>12 | Basic Data Bit Field | | Basic Data Bit Field | Basic Data Bit Field |
| 13<br>14<br>15<br>16 | | | Opposite Value Basic Data Bit Field | |

DECOMPACTION OF STORED DATA IN AUTOMATIC TEST SYSTEMS

BACKGROUND OF THE INVENTION

This invention was made with Government support under Contract Number DAAB07-82-C-H060 awarded by the U.S. Army Communications-Electronics Command. The Government has certain rights in this invention.

This application is a continuation-in-part of application Ser. No. 555,287 filed Nov. 25, 1983 of Philip Jackson now U.S. Pat. No. 4,656,632, which is assigned to the assignee of this application. The disclosure of said application Ser. No. 555,287 is incorporated herein by reference.

The present invention relates generally to an automated system for testing integrated circuits, electronic printed circuit boards and systems, and the like, and specifically to an automated testing system which stores data in compacted form, and to means for decompacting the data and applying it to a unit under test ("UUT").

The proliferation of integrated circuits in a wide variety of applications has led to a concommitant need for methods and apparatus to test the same and to do so in an effective and efficient manner. The principal approach, defined as functional digital testing, which has been used in the past to test such integrated circuits has been to apply a digital pattern (i.e., a series of ones and zeros) to the input pins of the UUT while monitoring the induced response at the output pins of the UUT. The rate at which such tests were performed was governed by the rate at which the test system was able to process input and output information, a speed not significantly slower than the speed in which earlier UUT's operated in actual circuit environments.

The increased use of medium scale integration ("MSI") and large scale integration ("LSI"), and therefore the density with which such components could be integrated into single units, has made it necessary to develop test systems which could more closely simulate the higher speeds at which the units would actually operate. In addition, it has become necessary to test integrated circuits for their response not only to simple digital inputs, but also to a full range of analog inputs, including complex wave forms, etc.

Known automatic test equipment ("ATE") typically have a maximum memory depth of 4,096 bits per channel, and typically have a single memory element per channel (apply or expect pattern), although some have two memory elements per channel. Many test programs require up to 30,000 vectors inorder to achieve reasonable fault coverage, and test programs having in excess of 250,000 vectors are estimated to be necessary when the impact of very large scale integration ("VLSI") and very high speed integrated circuits ("VHSIC") is considered. To run such programs on typical bus-type LSI-populated UUT with real-time bidirectional driver control and real-time masking of receivers, a realistic estimate is that in excess of 750,000 bits of memory are required per channel, which for a simple architecture would require two additional memory elements per channel. Thus, real-time testing is currently impossible with such test programs and existing ATE's since large time gaps are required to refill local memory from an external memory, and it would be impractical because of expense to simply expand the local memory to the depths that would be necessary.

Another constraint on real-time testing by current ATE architecture is local memory access time since the test data repetition rate is directly tied thereto. Maximum local memory access rates in current ATE's is only about 20 MHz, while 100 MHz is needed to achieve valid real-time testing.

One way to provide for real-time testing is to compact data stored in the local memory, decompact it and apply uncompacted data to the UUT. One scheme utilized compacted data formats of variable length, which made decompaction by hardware extremely complicated. Another compaction scheme utilized a compacted data format having a fixed length, which facilitated hardware decompaction, but compacted only a few patterns.

In response to the need for more effective and efficient ATE's, a so-called "pin electronics" ATE system for automatic testing of integrated circuits known as the Universal Pin Electronics ("UPE") System was developed. The UPE system is described in U.S. Army Communications-Electronics Command (Fort Monmouth, N.J. 07703) Report Number CECOM-81-0146-F, titled "Universal Pin Electronics" dated September 1982, which is incorporated herein by reference, and in the aforementioned application Ser. No. 555,287. The UPE system incorporates a plurality of channels, each of which is capable of selectively generating functional digital, parametric digital or analog stimuli and applying the same to a pin of the UUT, measuring th utput of a UUT pin and comparing the same with the expected pin output, or performing both stimulus and measurement functions on a given pin, as determined by user-provided software. (As used herein, "pin" refers to an output of an ATE or UPE, as well as to an input to a UUT.) The UPE architecture represents a significant breakthrough in ATE technology and has the potential to provide extensive analog and digital test capability with greatly improved reliability, in a much smaller physical package and at a reduced cost as compared to conventional ATE's.

The UPE system structures memory management differently than in prior pin electronics systems. For example, an A bit capacity memory in one pin electronics memory management structure was arranged in a single bit architecture, i.e. the memory for each pin was A bits deep by one bit wide and was accessed one bit at a time. In another prior pin electronics memory management structure, an A bit capacity memory was arranged in a multiple bit width architecture to simultaneously supply a number of pins, i.e, the memory was configured to be N bits wide by A/N bits deep, where N was the number of pins the memory supplied in parallel. Again, each pin received one data bit per memory access.

In the memory management structure of the UPE system, an A bit capacity memory for each pin is arranged in a multiple bit word architecture of N bits wide by A/N bits deep. However, the N bit wide word is supplied to a single pin, and a parallel to serial converter is interposed between the memory and the driver for that pin so that N bits are provided serially to the pin for each memory access. It is thus possible to gain effectively an N to 1 speed enhancement, which is not unlike "ping-ponging" or multiplexing memory and/or shift registers. A parallel to serial converter makes it possible to use memory with access times in the 30 to 50 nsec range to provide greater than 100 MHz data rate capability, even supporting two memory functions simultaneously (expected and masked, for example) through multiplexing or memory partitioning techniques.

The UPE system memory management structure permits D/A converters to be connected to receive the N bit wide parallel word directly from the same A bit capacity memory used to output digital test data for generating complex variable waveforms in much the same manner as present complex waveform generators perform the waveform generation function. In the UPE system, however, complex waveform generation is available on each and every UPE pin. Depending on the sampling rate, accurate depictions of sine waves, triangle waves, and in essence, any periodic or aperiodic arbitrary waveform, can be generated by the UPE and presented to each UUT pin.

However, even with a parallel to serial converter and an N to 1 speed enhancement in the memory access time, the UPE is not capable of carrying out currently required test sequences in real-time because of the need to frequently stop testing and refill the memory local to each UPE channel.

There is thus a need for ATE which can apply and receive larger amounts of data at higher repetition rates to achieve real-time testing.

OBJECTS AND SUMMARY OF THE INVENTION

It is an object of the present invention to improve memory management in electronic systems.

It is another object of the present invention to improve automatic test equipment, particularly UPE systems.

It is another object of the present invention to improve the real-time testing capability of automatic test equipment, particularly UPE systems.

It is another object of the present invention to improve the memory management of automatic test equipment, particularly UPE systems.

It is another object of the present invention to improve data transfer between automatic test equipment, particularly UPE systems, and a UUT.

The invention achieves the above and other objects by storing data in compacted parallel form and decompacting the data and presenting it to a UUT in uncompacted serial form. Decompaction means according to the invention decodes the compacted parallel data and provides serial uncompacted data to a pin of the UUT or to a receiver comparison circuit in real-time.

The decompaction means of the invention is especially suited for use in UPE systems having a plurality of independent channels providing data to a UUT on a corresponding number of pins. In such a system, the applicant recognized that compaction and decompaction for each pin can take place independently of compaction and decompaction on any other pin. The applicant further recognized that decompaction in a UPE should take place simultaneously on many pins, and that it was not feasible to accomplish this with software because of prohibitive cost and space requirements in the UPE. In addition, since very high speed testing (up to 100 MHz) was required, the applicant concluded that microprocessors were not suitable because they operate by sequentially executing a set of instructions and would have to have an internal clock that is much faster than the algorithm being executed. Based on these considerations, the applicant concluded that decompaction should be carried out by hardware while compaction could be implemented with software.

In a specific embodiment, the decompaction means comprises means for storing parallel data comprising compacted and umcompacted binary data and a compaction code (such parallel data which includes a compaction code being referred to below as "compacted data"); first selectively enablable decoder means for decoding the data in the compacted binary data and selectively generating uncompacted binary data therefrom; second selectively enablable decoder means for decoding the data in the compacted binary data and generating uncompacted binary data therefrom; decoding means for decoding the compaction code and selectively causing at least one of the first and second decoder means to be enabled in accordance therewith; and control means for reading compacted data from the means for storing and causing the compaction code to be supplied to the decoding means and at least part of the data in the compacted data to be supplied to the selectively enabled decoder means, and for causing uncompacted data to be output by the selectively enabled decoder means. The decompaction means can include more than one first decoder means and more than one second decoder means, and can also include further decoder means. The uncompacted binary data generated by at least one of the first and second decoder means has a greater number of bits than the data contained in the compacted binary data. Coupling means are provided to selectively couple the data output by the first and second decoder means to an output of the decompaction means, and the control means causes the coupling means to couple data output by one of the first and second decoder means to the decompaction means output at a time. The first and second decoder means can each include an output means for outputting serial uncompacted data or an output means can be selectively coupled to the first and second decoder means for outputting uncompacted serial data, and the control means causes the output means serially to output uncompacted data generated by the first and second decoder means such that the output data repetition rate is faster than the memory access time.

In the preferred embodiment, the first and second decoder means generate parallel uncompacted data and/or parallel data is supplied to the coupling means from the storing means when the first decoder means is enabled, and the coupling means provides this parallel data to the output means. The coupling means comprises multiplexer means and the output means comprises storage means coupled to the output of the multiplexer means. The multiplexer means can comprise first and second multiplexer means and the storage means can comprise first and second output storage means. The first multiplexer means selectively supplies parallel uncompacted data from the first and second decoder means to the first output storage means and the second multiplexer means selectively supplies parallel uncompacted data from the first and second decoder means to the second output storage means. The first and second output storage means temporarily store the parallel uncompacted data until it is to be serially output to the decomposition means output. The control means alternately causes the first multiplexer means to supply data from one of the first and second decoder means to the first output storage means and the second multiplexer means to supply the data from said one decoder means to the second output storage means, and to alternately cause data to be serially outputted from the output storage means that is not receiving data from the first and second multiplexer means.

One embodiment of a first decoder means includes means for receiving a first part of the data in the compacted data from the storing means while a second part of the data in the compacted data is supplied to the multiplexer means from the storing means. The control means causes the first decoder means to output all, some or none of the first part of the data to the multiplexer means and couples the multiplexer means to the output means when the first decoder means is enabled to supply both parts of the data to the output means. In this embodiment, the data in the compacted data word supplied to the first decoder means is absolute data, i.e. it is not compacted.

One embodiment of a second decoder means receives the parallel compacted data and comprises means for generating uncompacted binary data of all ones, all zeros or alternating ones and zeros of a selectable length. Another embodiment of a second decoder means receives parallel compacted data and comprises means for generating uncompacted binary data consisting of a repeatable fixed pattern of ones and zeros. The embodiments of the second decoder means described herein receive all of the parallel compacted data (excluding the decompaction code) and generate uncompacted binary data based on the compacted data. However, some of the compacted data could be supplied to the multiplexer means as absolute data, if desired.

The decompaction means can also include a third decoder means which receives compacted binary data and causes, in cooperation with the control means, sequences of uncompacted data to be provided by at least one of the first and second decoder means based on the data supplied to the third decoder means. The third decoder means can include means for receiving a first part of the data in the compacted data from the storing means while a second part of the data in the compacted data is supplied to the multiplexer means from the storing means.

In the preferred embodiment, the decompaction means comprises a decompaction module connected in a UPE system between the UPE local memory and the UUT. A preferred embodiment of the decompaction module comprises one first decoder means (code A decoder), two second decoder means (code B and code C decoders) and one third decoder means (code D decoder). The UPE local memory constitutes the storing means of the decompaction means and supplies compacted and uncompacted data to the UPE and to the decompaction module. The local memory is configured to be N bits wide and m bits deep, where N can be 16 and m can be 2K, for example. Since the decompaction means can provide serial uncompacted data from parallel compacted data having absolute or uncompacted data, the parallel to serial converter heretofore disposed between the local memory and the UUT can be dispensed with. Each UPE channel can continue to include a D/A converter which provides complex variable wave forms to the UUT from the parallel digital data stored in the local memory.

The parallel data in the local memory is accessed by a local memory address controller (part of the control means) and provided in fixed width words of N bits, e.g. 16 bits, to the UPE. Depending on whether the UPE is operating in a compacted data mode or an uncompacted data mode, the data words from the local memory are provided to the decompaction module or to other components of the UPE such as the D/A converter. All compacted data words to be processed by the decompaction module have a compaction code embedded in the N-bit word. In the compacted mode, the decompaction module receives the compacted N bit data word in a temporary storage means such as a holding register. The decoding means receives the compaction code, decodes it and selects which of the first, second or third decoder means is to provide uncompacted data. The selected first or second decoder means then decompacts the compacted data or handles the absolute data in the data word held in the temporary storage means and provides uncompacted data which is loaded via the multiplexer means into output shift registers (output means). The data is then serially transmitted in real-time from the output shift registers via a driver to the UUT pin. Two multiplexers (the first and second multiplexer means) and two output shift registers (the first and second output storage means) are provided so that while uncompacted data is being shifted out of one shift register, additional uncompacted data is being loaded from the memory into another shift register via one of the multiplexers. The output shift registers are alternately clocked to output the uncompacted data to the UUT continuously and this sequence is repeated until the data has been exhausted to the depth of the test pattern being applied.

Compaction algorithms are used to compact data according to the compaction codes to accommodate the more prevelant sequences of repetitive coded data. Absolute data is inserted into compacted data words which are also identified by a compaction code and which are stored, retrieved and processed along with compacted data words. The decompaction means can provide uncompacted serial data of from 8 bits to 4096 bits in length in a relatively large number of repetitive patterns from a single compacted data word. In addition, the decompaction means can provide sequences of uncompacted serial data from a single compacted data word by automatically accessing a sequence of compacted data words and decompacting them.

Thus, data decompaction allows large numbers of test vectors to be stored in relatively small amounts of local memory and increases the repetition rate of the UPE consistent with the N to 1 enhancement possible with a parallel to serial converter. Also the decompaction means frees the UPE repetition rate from the local memory access time and the word length of the local memory. (In essence, the local memory speed is multiplied by the data compaction ratio insofar as UPE/UUT test rates are concerned.) For example, compacted data accessed from a memory at 30 MHz when decompacted in accordance with the invention can provide sufficient data to allow a UPE to operate at repetition rates far in excess of 100 MHz even when multiple functions such as expect and mask data are being multiplexed from the same memory.

The use of an N bit wide memory word and the decompaction means permits a UPE channel to essentially be divided into higher and lower speed sections. The higher speed section need only include elements such as the decompaction module elements, driver-receiver, clock, comparators, etc., whereas much of the remaining UPE such as I/O interface, level generation, local memory, local memory control, etc. can operate at lower speeds.

The decompaction means enables the UPE to dramatically increase overall test throughput. A significant amount of time was heretofore required to transfer the large amounts of array or vector data from the UPE system bulk storage medium (e.g. disk) to the UPE local memory via the system I/O. The bit width and the transfer time of the typical I/O bus is a major constraining factor in ATE systems. The transfer time is much longer than the actual test time in many cases. The decompaction means decreases this transfer time drastically since the data is stored in compacted form and decompacted in real-time by the decompaction means as the test program progresses, so that overall test time (transfer plus actual execution) is significantly reduced.

The above and other objects, advantages, aspects and features of the present invention will be more readily perceived from the following description of the preferred embodiments taken with the accompanying drawings and appended claims.

BRIEF DESCRIPTION OF THE DRAWINGS

The present invention is illustrated by way of example and not limitation in the figures of the accompanying drawings in which like reference numbers indicate like parts and in which:

FIG. 9 is a diagram illustrating three types of compacted data words and one type of an uncompacted data word stored in the local memory of the UPE depicted in FIG. 1.

DESCRIPTION OF THE PREFERRED EMBODIMENTS

Figure 1:
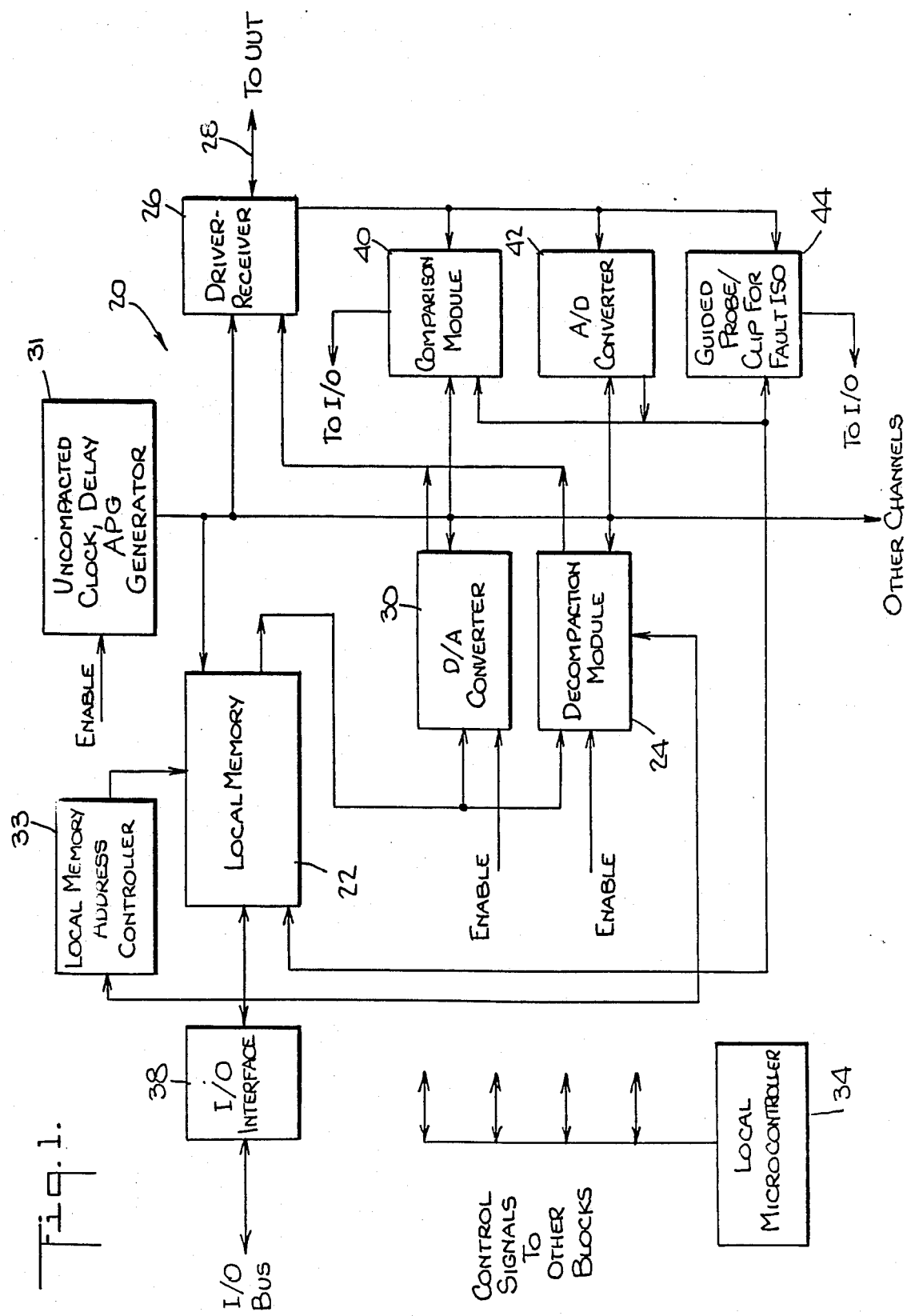
FIG. 1 is a block diagram of one channel of a UPE system including a decompaction module according to the present invention.

UPE Block Diagram (FIG. 1)

Referring first to FIG. 1, a block diagram of a single channel of a UPE 20 incorporating decompaction means according to the present invention is depicted. The UPE 20 includes a local memory 22 which stores uncompacted data and compacted data in various coded formats, a decompaction module 24 and a driver-receiver 26 which either outputs data from the channel of the UPE 20 on UPE pin 28 to a UUT or inputs data from the UUT. The UPE 20 can also include a D/A converter 30 which receives uncompacted data from the local memory 22 in an uncompacted mode of operation of the UPE and provides analog parametric data to the driver-receiver 26 for transmission to the UUT on pin 28, and a number of clocks, delays and algorithmic pattern generators (APG) in an uncompacted data generator 31 which applies uncompacted data to the driver-receiver 26. The uncompacted data generator 31 outputs one of a number of clocks, or one of a number of non-variable algorithmic sequences each of which is fixed prior to the test and hardwired to a particular channel. The uncompacted data generator 31 is operated in an uncompacted data mode of the UPE under control of a local microcontroller 34, which can be shared by more than one channel of the UPE 20.

The decompaction module 24 in the compacted mode of operation of the UPE receives compacted data from the local memory 22, as described below, and applies it to the driver-receiver 26 for transmission to the UUT on pin 28. A local memory address controller 33 controls addressing of the local memory 22 to provide compacted data to the decompaction module 24. The data supplied to the decompaction module 24 is referred to herein as compacted data, although such data can include uncompacted or absolute data as well. All such data supplied to the decompaction module 24, however, includes a compaction code which is used to determine whether the data is compacted or uncompacted.

The local microcontroller 34 controls operations of the UPE including loading of the local memory 22 via an I/O interface 38, and supplying of enable and/or control signals to the D/A converter 30, the uncompacted data generator 31, the decompaction module 24, and the local memory address controller 33.

The UPE 20 depicted in FIG. 1 is also capable of receiving data from the receiver portion of the driver-receiver 26 and providing it to a comparison module 40, an A/D converter 42 and a fault isolater 44.

Further details of the overall UPE system can be found in the aforementioned U.S. Army Communications—Electronics Command Report Number CECE-OM-81-0146-F and in the aforementioned application Ser. No. 555,287.

Figure 2:
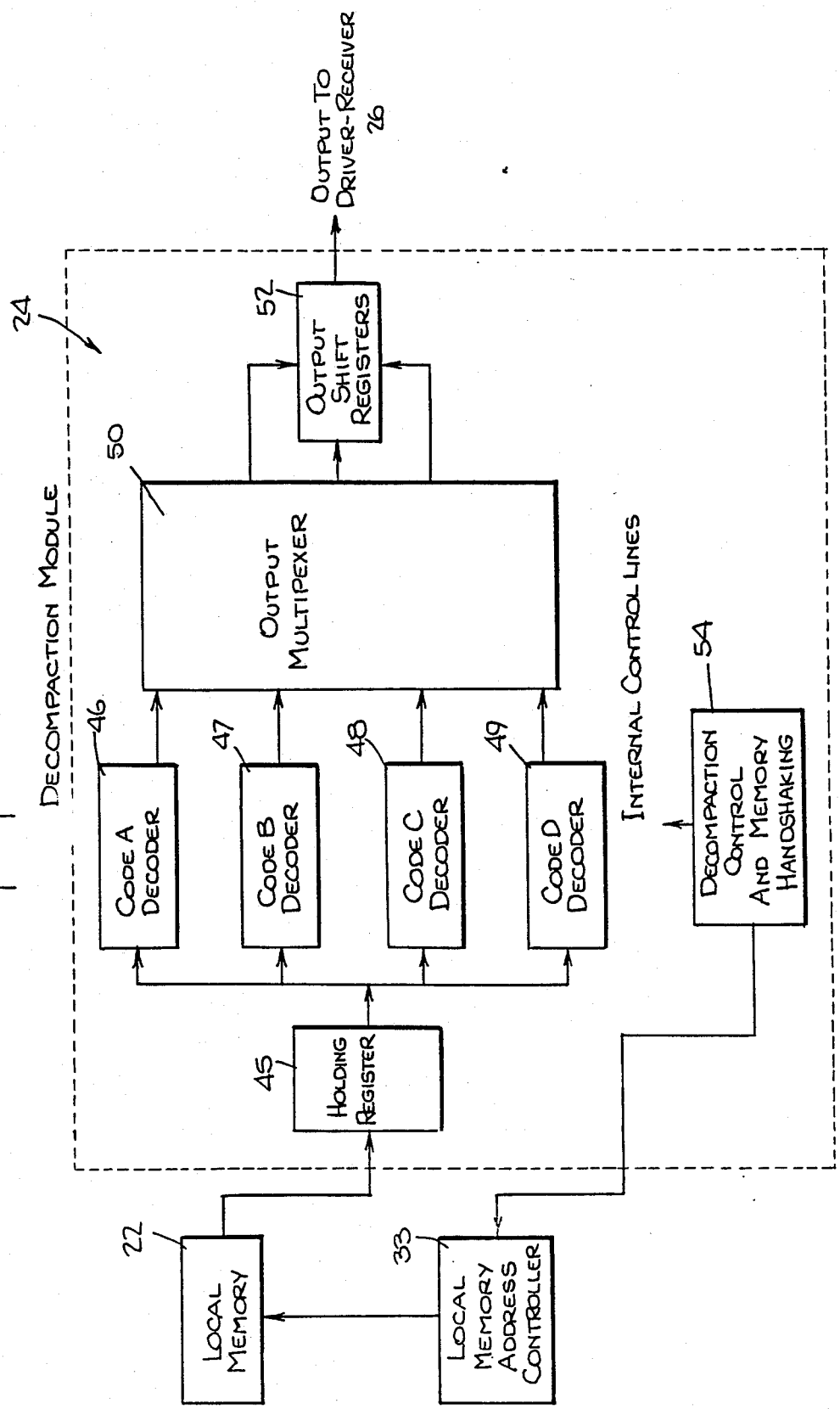
FIG. 2 is a block diagram of the decompaction module of FIG. 1 coupled to the local memory and the local memory address controller of the UPE.

Decompaction Module Block Diagram (FIG. 2)

Referring now to FIG. 2, a block diagram of the decompaction module 24 is depicted connected to the local memory 22 and the local memory address controller 33. The decompaction module 24 includes a holding register 45 which is coupled to the local memory 22 to receive and temporarily store compacted data therefrom to be decompacted by the decompaction module in the compacted mode of operation of the UPE. The holding register 45 is coupled to four decoders, code A decoder 46, code B decoder 47, code C decoder 48 and code D decoder 49, which provide uncompacted data from the compacted data obtained from the local memory 22 via the holding register 45 in accordance with coded information contained in the compacted data. Among the data in the compacted data words stored in the local memory 22 is the compaction code contained in a compaction code indentifier field (see FIG. 9) which identifies the word as a code A, B, C or D word and specifies which decoder is to provide the uncompacted data. The decompaction module 24 also includes a four channel output multiplexer 50, output shift registers 52 and a decompaction control and memory handshaking 54.

The local memory 22 in a UPE system channel is used for a number of purposes and in a number of modes. When the UPE is in the data set-up mode, the local memory 22 is filled for subsequent testing in the test execution mode. The decompaction module 24 is utilized for functional digital testing and dynamically decodes compacted data for use in this mode. When the decompaction module 24 is enabled, compacted data is transmitted to the holding register 45 in the decompaction module 24 from which the data is restructured into decompacted formats for transmission to the UUT in real time based on the compaction code and other fields contained in the word.

The local memory 22 can nominally be of 32,768 bits capacity arranged in a 16 bit word by 2048 word matrix. However, other configurations can be used. The decompaction module 24 transforms the 16 bit wide compacted or uncompacted data from the local memory into a one bit wide stream suitable for driving one of the following functions: data value, mask enable or tristate enable. The one bit wide uncompacted data stream is presented at a rate of from 8 to 4096 times the rate that the local memory 22 is accessed depending on the compaction code and data fields of the compacted data. The minimum uncompacted data word length output by the decompaction module in the preferred embodiment is 8 bits.

In operation, the local memory 22 is addressed by the local memory address controller 33 in cooperation with the decompaction control and memory handshaking 54 to provide compacted data words to the decompaction module 24. The decompaction control and memory handshaking 54 decodes the code identifier field in a compacted data word and enables the particular decoder 46, 47, 48 or 49 identified by the code identifier field; and the enabled decoder provides uncompacted data to the output multiplexer 50 in accordance with further code and/or data fields contained in the compacted data word. The output multiplexer 50 supplies the uncompacted data to the output shift registers 52 which alternately supply data for serial transmission to the driver-receiver 26 (not shown in FIG. 2) of the UPE.

Compacted and Uncompacted Data Words (FIG. 9)

The local memory 22 of the UPE 20 is configured to store 16 bit wide compacted data words, i.e. a word having a compaction code, which are supplied to the decompaction module 24 for decompaction. FIG. 9 depicts four general classes of compacted data words having 2 bit compaction codes designated by "code A", "code B", "code C" and "code D". A code A word contains uncompacted or absolute data, while codes B, C and D words contain compacted data under various formats. A code D word can also include absolute data in addition to the compacted data. The code word identifier field specifies which decoder 46, 47, 48 or 49 is to provide the uncompacted data. Each of the four different types of compacted data words also includes data formating fields and/or basic data fields from which uncompacted data strings of up to 4096 bits long are formulated, as described below.

It should be noted that compacted data words of 16 bits width, and uncompacted serial data strings of from 8 to 4096 bits long per 16 bit compacted data word are exemplary.

Figure 3:
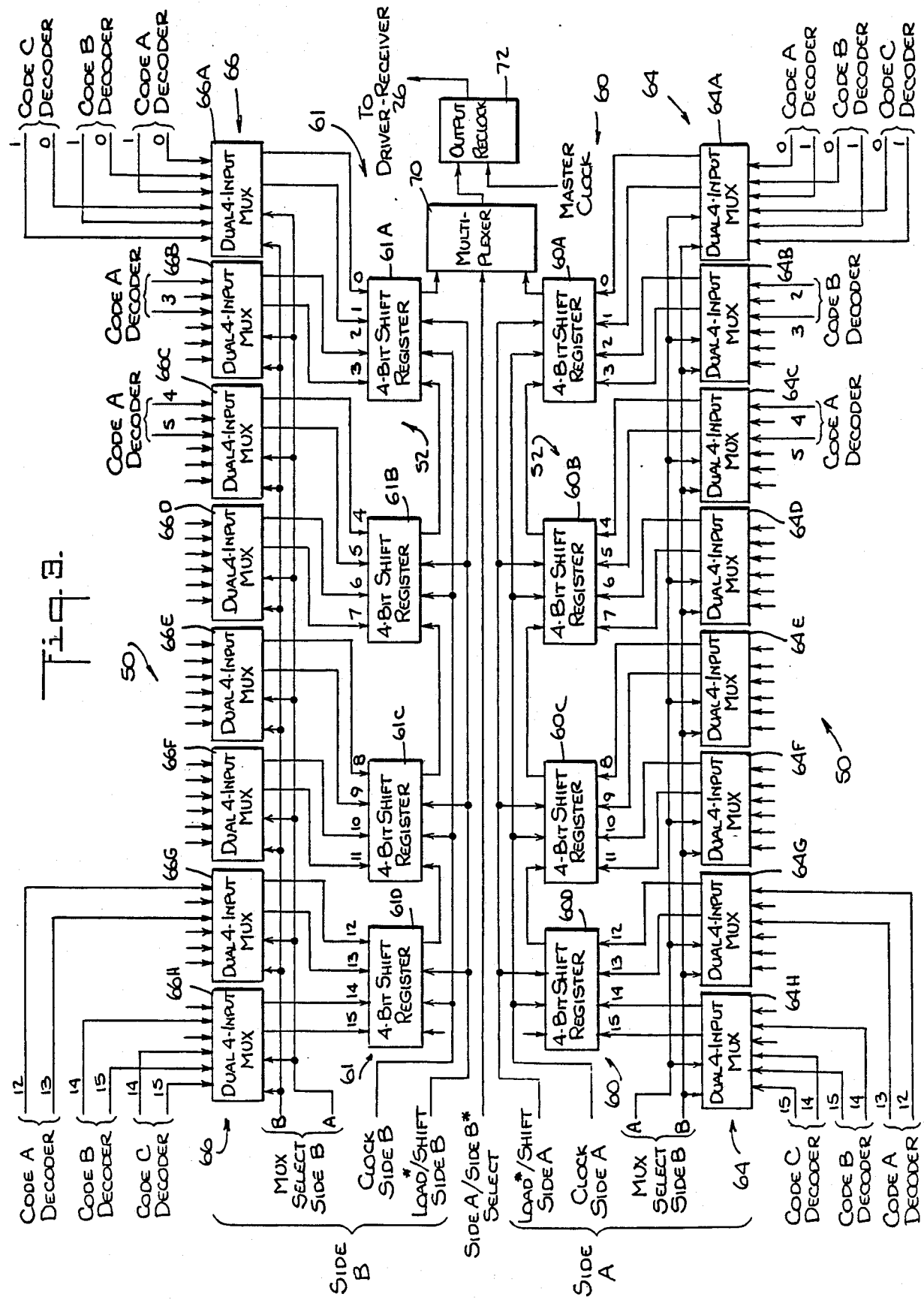
FIG. 3 is a block diagram of the utput multiplexer and the output shift registers of the decompaction module depicted in FIG. 2.

Output Multiplexer 50 and Output Shift Registers 52 Block Diagram (FIG. 3)

A block diagram of the four channel output multiplexer 50 and the output shift registers 52 is depicted in FIG. 3. Output multiplexer 50 and output shift registers 52 are separated into side A and side B multiplexers and shift registers. Data is alternately loaded into and shifted out of the side A and side B shift registers in ping-pong fashion, i.e. side A shift registers are loaded while side B shift registers output data prevously loaded in, and vice versa. The output shift registers 52 comprise a side A 16-bit, parallel in, serial out shift register 60 and a side B 16 bit, parallel in, serial out shift register 61, each of which can, but need not, be configured as a string of four 4-bit shift registers 60A-D and 61A-D. Each of the shift registers 60A-D and 61A-D are four bit parallel in, serial out shift registers.

The four channel output multiplexer 50 includes a side A multiplexer 64 coupled to the side A shift register 60 and a side B multiplexer 66 coupled to the side B shift register 61. Each of the multiplexers 64 and 66 is a 48 bit parallel input, 16 bit parallel output multiplexer, and can, but need not, be configured by eight dual 4-input, 2-output multiplexers 64A-H, 66A-H, with only six of the eight inputs of each multiplexer being utilized. Each multiplexer 64A-H, 66A-H provides two bits of up to 16-bits of uncompacted data which can be output by the side A, side B 16 bit output shift registers.

Multiplexers 64 and 66 each have a total of 48 inputs connected to receive up to 14 bits of parallel uncompacted data at a time from the code A decoder 46, up to 16 bits of parallel uncompacted data at a time from the code B decoder 47, and up to 16 bits of parallel uncompacted data at a time from the code C decoder 48. As discussed below, the outputs of the code D decoder 49 are not connected directly to the multiplexers since code D uncompacted data comprises sub-functional groupings of code A, code B and code C data in different sequences. Thus, the first and third inputs (counting from the right) of the multiplexer 64A are connected to the code A decoder 46, the second and fifth inputs are connected to the code B decoder 47, and the third and sixth inputs are connected to the code C decoder 48, and multiplexer 64A provides bit zero and bit one of the output of the particular A, B or C decoder which has been enabled to bit 0 and bit 1 of the shift register 60A. Correspondingly, multiplexer 64B provides bits 2 and 3 to shift register 60A, multiplexers 64C and 64D provide bits 4-7 to shift register 60B, etc. Similarly, multiplexers 66A and 66B provide bits 0-3 to shift register 61A, multiplexers 66C and 66D provide bits 4-7 to shift register 61B, etc.

The inputs to multiplexer 64A-H and corresponding inputs to multiplexers 66A-H are connected in parallel with each other so that uncompacted data is simultaneously provided in parallel to the side A and side B multiplexers 64 and 66. Only one of the multiplexers 64, 66 however outputs data to a respective shift register 60, 61 at a time depending on the 2-bit "MUX select side A" and "MUX select side B" signals provided by the decompaction control and memory handshaking 54 to the enable inputs of the multiplexers 64, 66. Similarly, one of the shift registers 60 or 61 is loaded at a time depending on the "load*/shift side A" and the "load*/shift side B" signals provided by the decompaction control and memory handshaking 54. (An asterisk denotes that the signal is active in the low state.) The shift registers 60 and 61 are thus loaded in alternate or ping-pong fashion, while the opposite side shift register is unloading data to a multiplexer 70 as clocked by a "clock side A", or a "clock side B" signal supplied by the decompaction control and memory handshaking 54. The multiplexer 70 throughputs data to the output reclock 72 from either the side A shift register 60 or the side B shift register 61 depending upon the "side A/side B* select" signal provided by the decompaction control and memory handshaking 54 to the multiplexer 70. Reclock 72 synchronizes the data output by the multiplexer 70 with a master clock supplied by the decompaction control and memory handshaking 54 and supplies it to the driver-receiver 26 in FIG. 1.

Figure 4:
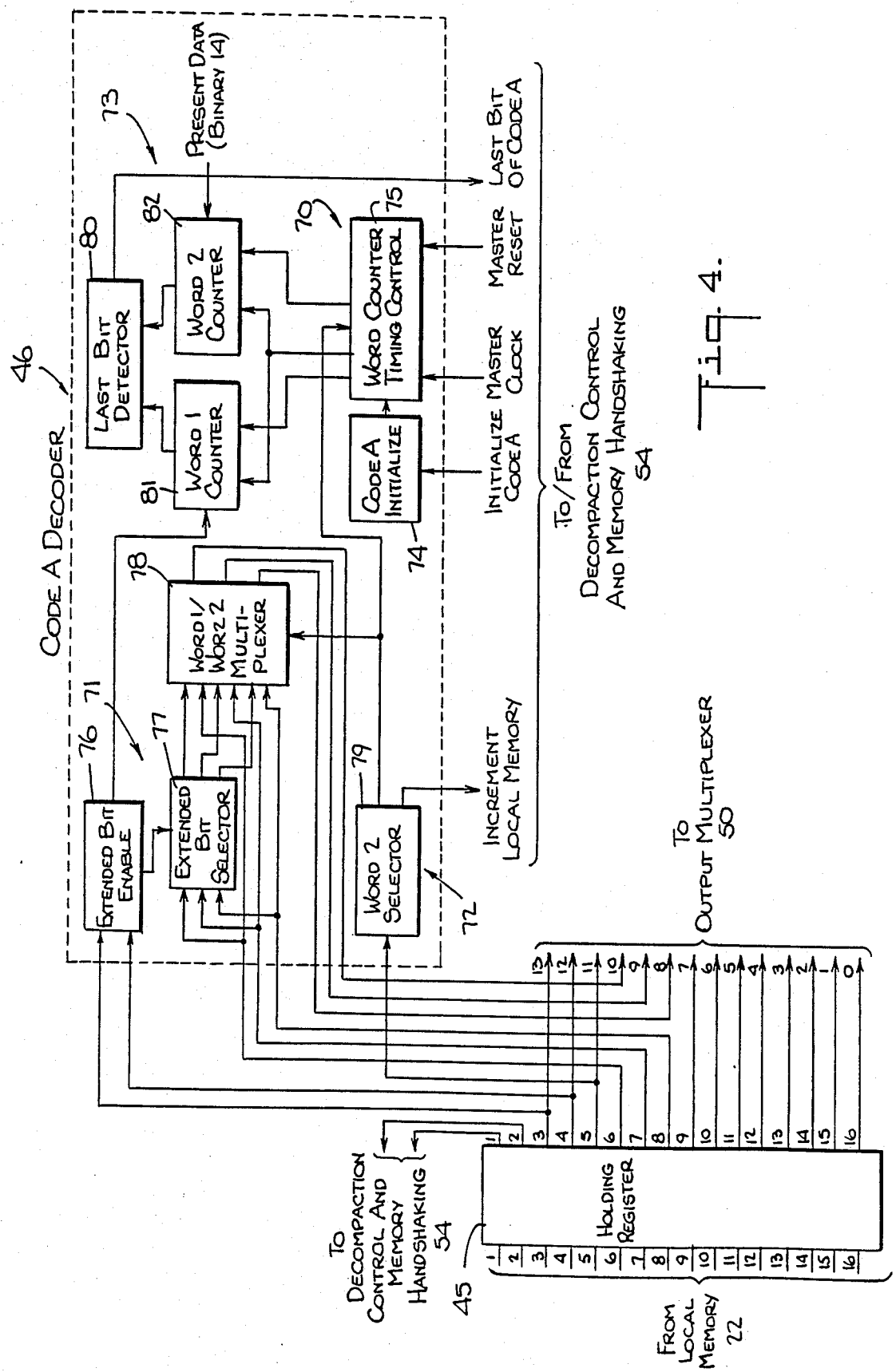
FIG. 4 is a block diagram of the code A decoder of the decompaction module depicted in FIG. 2.

Code A Decoder (FIG. 4)

Code A data words include uncompacted basic data strings of from 8 to 11 bits which are not readily compactable, i.e., the basic data cannot be compacted into compacted code B and code C data words. Code A uncompacted, absolute data is typically inserted into strings of data uncompacted by decoders B and C to frame such data according to a code D sequence. Although the data is code A words is essentially uncompacted, code A words are retrieved from the local memory 22 in the same way as other compacted data words.

Referring first to FIG. 9, a code A word includes the two bit code word identifier field (bits 1-2), a two bit word length field (bits 3-4), a one bit word number selector field (bit 5), a three bit extended data bit field (bits 6-8) and an eight bit basic data bit field (bits 9-16). The code word identifer field identifies whether the 16-bit word is a code A, code B, code C, or code D word. The data word length field determines whether the data length of a code A word is 8, 9, 10, or 11 bits long while the extended data bit field contains the basic data of extended data bits 9-11. Thus, each code A word includes a minimum of eight basic data bits in the basic data bit field and up to three additional data bits in the extended data bit field. The word number selector field specifies whether the code A word is a single 8-11 bit word or two words, an 8-11 bit word followed by a second fixed length word of up to 14 bits. Bits 9-16 contain basic data and constitute the minimum data word length of a code A word.

The code A decoder 46 depicted in FIG. 4 essentially takes uncompacted data with a minimum word length of eight bits (basic data bit field) and supplies this data to the side A and side B output multiplexers 64, 66 to be loaded into the side A or side B shift register 60 or 61 in FIG. 3. The code A decoder includes an initializing/timing control section 70, an extended bit selector section 71, a word number selector section 72 and a last bit detector section 73. The initialize/timing control section 70 includes a code A initialize circuit 74 and a word counter timing control 75 which perform handshaking functions. Sixteen bit compacted data words are loaded into the holding register 45, from which the first two bits of the compacted word, i.e. the code word identifier field, are supplied to the decompaction control and memory handshaking 54 depicted in FIG. 8 which decodes the code word identifier field and provides an initialize signal to the decoder specified in that field. When the code word identifier field specifies that the word is a code A word, an "initialize code A" signal is provided by the decompaction control and memory handshaking 54 to the code A initialize circuit 74 which enables the word counter timing control 75 to activate operation of the code A decoder 46.

The extended bit enable section 71 determines whether the compacted code A word is 8, 9, 10 or 11 bits and includes an extended bit enable 76 which receives the two bit word length field (bits 3-4) from the holding register 45 and decodes it. When the word length field specifies that more than eight basic bits of data are present in the code A word, the extended bit enable 76 enables an extended bit selector 77. The extended bit selector 77 receives the three bit extended data bit field (bits 6-8) from the holding register 45 and when enabled selects one, two or three of the extended data bits for transmission to the output multiplexer 50 through a word 1/word 2 multiplexer 78.

The word selector section 72 determines whether the code A data is one or two words long. It includes a word 2 selector 79 which receives the single bit word number selector field (bit 5) from the holding register 45 and decodes it. If the word number selector field specifies two words, then the word 2 selector 79 supplies an "increment local memory" signal to the decompaction control and memory handshaking 54 which causes the local memory 22 to be incremented to the next memory location and a second code A word of up to 14 bits in length to be loaded into the holding register 45. Bits 3-5 and 9-16 of the second word are supplied directly to the output multiplexer 50 while bits 6-8 are supplied through the word 1/word 2 multiplexer 78 as conditioned by an output of the word 2 selector 79.

The last bit detector section 73 determines when the last bit of a code A word has been supplied to the output multiplexer 50 and includes a last bit detector 80, a word 1 counter 81 and a word 2 counter 82. The extended bit enable 76 is coupled to the word 1 counter 81 as a present and presets the word 2 counter 81 for a countdown of 8, 9, 10 or 11 bits depending on the content of the code word identifier field. A fixed preset is set into the word 2 counter 82 corresponding to the number of bits (e.g., 14 bits) in the second code A word. If the word number selector field specifies a single word, then the word 1 counter is clocked via a master clock from the decompaction control and memory handshaking 54 through the word counter timing control 75 until the word 1 counter counts out, at which time the last bit detector 80 will output the last bit of code A signal to the decompaction control and memory handshaking 54 to indicate that the last bit of a code A word has been shifted out of the shift registers 52. If the word number selector field of the code A word specifies that a second word is to follow, this information is transmitted to the word counter timing control 75 which causes the master clock to be coupled to the word 2 counter 82, and the last bit detector 80 will not provide a "last bit of code A" output to the decompaction control and memory handshaking 54 until the last bit of the second code A word has been output shifted out of the shift registers 52.

The uncompacted data in a code A word is contained in bits 6 through 16 of a first code A word, and in bits 3-16 of a second code A word, when one is specified. As discussed below, code A uncompacted data can be used to frame the beginning and end of the longer uncompacted data sequences obtained from code D words, and optimize positioning of sequential strings of code B and C words.

Figure 5:
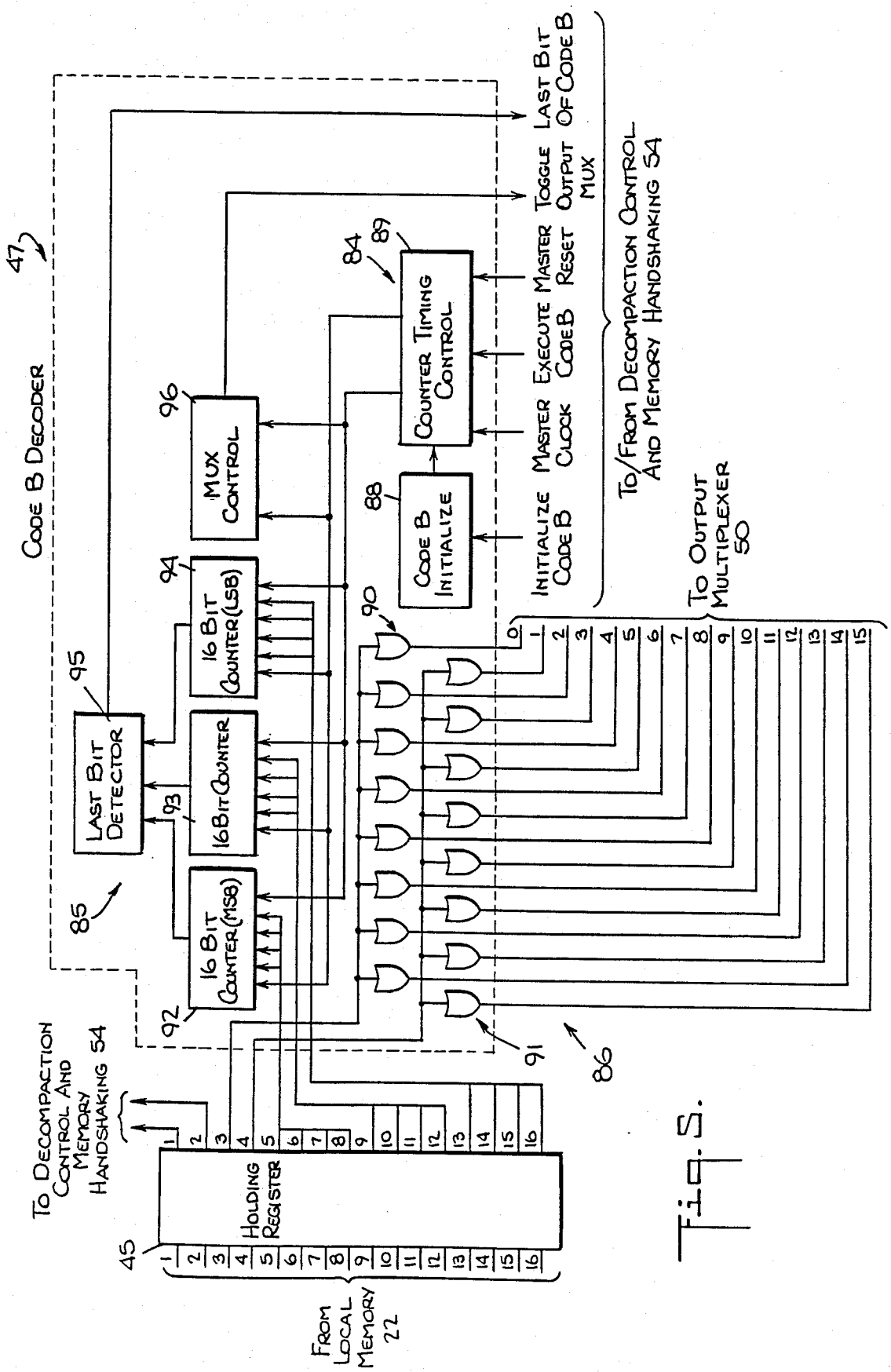
FIG. 5 is a block diagram of the code B decoder of the decompaction module depicted in FIG. 2.

Code B Decoder (FIG. 5)

Uncompacted results of code B data are repetitive strings of code, such as all ones, all zeros and alternating ones and zeros.

Referring to FIG. 9, the first two bits of a code B word define the code word identifier field, as in a code A word. The third and fourth bits define a two bit basic data pattern field which specifies what the sequence of data is, i.e., all zeros, all ones or alternating zeros and ones. Bits 5 through 16 define a basic data length field which determines the number of bits in the basic data pattern which can be from 8 to 4096 bits. For example, the basic data pattern field can define a sequence of alternating zeros and ones and the basic data length field can define a string of 96 bits of alternating zeros and ones.

The code B decoder 47 depicted in FIG. 5 includes an initialize/counter timing control section 84, a counter/last bit detector section 85 and a data output section 86. Bits 1 and 2 (code word identifier field) of the code B word held in the holding register 45 are supplied to the decompaction control and memory handshaking 54 for decoding. The initialize/counter timing control section 84 includes a code B initialize 88 which enables a counter timing control 89 when the decompaction control and handshaking 54 has decoded a code B word identifier field and supplied an "initialize code B" signal to the code B initialize 88.

The data output section 86 comprises gates 90 connected to bit 3 of the code B word in the holding register 45 (one bit of the basic data pattern field) which provide even numbered basic data bits (0, 2, 4, 6 ... 14) to the output multiplexer 50, and gates 91 connected to bit 4 of the code B word (second bit of the basic data pattern field) and providing odd numbered basic data bits (1, 3, 5, 7 ... 15) to the output multiplexer 50. A string of gates 90, 91 is provided to prevent fan-out problems. Thus, alternate lines in the data output section 86 to the output multiplexer 50 are connected to one of the bits of the basic data pattern field in the compacted code B word held in the holding register 45. If both bits of the basic data pattern field are zeros or ones, then all lines in the data output section 86 to the output multiplexer 50 are zeros or ones, respectively. If one of the bits of the basic data pattern field is a zero and the other is a one, then the output lines to the output multiplexer 50 will be alternate zeros and ones or alternate ones and zeros depending on which of the bits of the basic data pattern field is a one and a zero.

The counter/last bit detector section 86 determines the number of bits of data to be output from the output shift registers 52 and when the last bit has been shifted out of the output shift registers. Bits 5–16 of the code B word, which define the basic data length field, are connected as presets to 16 bit down counters 92, 93 and 94 which together constitute a down counter capable of counting 4096 bits down in a multiplexed fashion. Counters 92–94 count out after the number of bits of basic uncompacted data have been shifted out of the output shift registers 52 corresponding to the presets to the counters specified by the basic data length field. A last bit detector 95 is connected to counters 92–94 which detects the count out of counters 92–94 and supplies a "last bit of code B" signal to the decompaction control and memory handshaking 54 to signify that all of the uncompacted data has been shifted out of the output shift registers 52. The counter timing control 89 receives a "master reset" from the decompaction control and memory handshaking 54 and when enabled by the code B initialize 88 initializes counters 92–94 and a MUX control 96.

The counter timing control 89 also receives an "execute code B" signal from the decompaction control and memory handshaking 54, which is supplied as a toggle signal to the MUX control 96. In response, the MUX control 96 outputs a "toggle output MUX" signal to the decompaction control and memory handshaking 54, which provides the "MUX select side A" and "MUX select side B" signals and the "load*/shift side A", "load*/shift side B" signals to the output multiplexer 50 and output shift registers 52 (FIG. 2), respectively, to control ping-ponging of the output shift registers 60, 61, so that the proper sequence of zeros and/or ones is shifted out of the shift registers.

Figure 6:
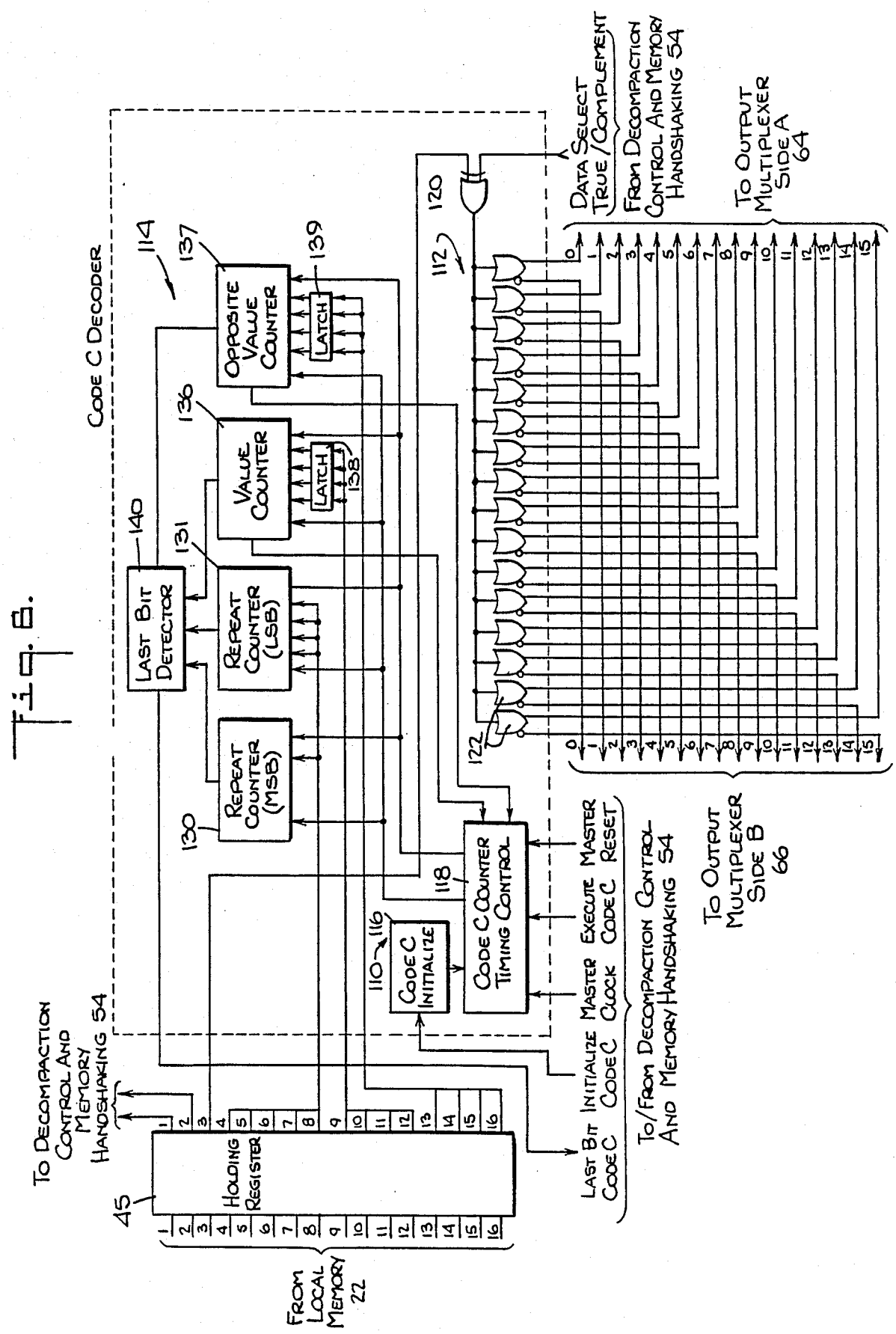
FIG. 6 is a block diagram of the code C decoder of the decompaction module depicted in FIG. 2.

Code C Decoder (FIG. 6)

Code C data provides repetative sequences of odd numbers of codes, for example, the code "11100" repeated seven times. The fixed patterns can be up to 32 bits in length repeated up to 31 times.

Referring to FIG. 9, the first two bits of a code C word define the code word identifier field, as in code A and code B words. The third bit of a code C word defines a first basic data bit field which specifies whether the first bit of the uncompacted code C data is a one or a zero. The fourth through eight bits define a pattern repeat field which specifies the number of times a given pattern is to be repeated. Bits 9 through 12 define a basic data bit field which specifies the number of consecutive ones in a given pattern. Bits 13 through 16 define an opposite value basic data bit field which specifies the number of consecutive zeros in a given pattern.

The code C decoder 48 depicted in FIG. 6 includes an initialize/counter timing control section 110, a data output section 112, and a counter/last bit detector section 114. The initialize/counter timing control section 110 includes a code C initialize circuit 116 which receives an "initialize code C" signal from the decompaction control and memory handshaking 54 when the first two bits from the holding register 45 have been decoded as a code C word, and in response thereto enables the code C counter timing control 118.

The third bit of a code C word defining the first basic data bit field is supplied to an exclusive OR gate 120 whose outputs are connected to a string of complementary output OR gates 122. A string of gates is used rather than a single gate to avoid fan-out problems. The true output of each of the complementary output OR gates 122 is connected to side A multiplexer 64 of the output mutliplexer 50 while the complementary output of each OR gate 122 is connected to side B multiplexer 66. As described below, the counter/last bit detector section 114 and the initialize/counter timing control section 110 cause the output shift registers 60, 61 to ping-pong depending on the number of consecutive ones and zeros in an uncompacted code C word. A second input to the exclusive OR gate 120 is the "data section true*/complement" signal from the decompaction control and memory handshaking 54. This signal ensures that the logic levels are initially supplied to the side A and side B multiplexers in the proper order.

Bits 4 through 8 defining the pattern repeat field of a code C word are connected as presets to repeat counters 130, 131 in the counter/last bit detector section 114 so that the repeat counters 130, 131 will count out when the basic pattern has been repeated the number of times specified in the pattern repeat field. Bits 9 through 12 of a code C word defining the basic data bit field are supplied to value counter 136 and bits 13–16 defining the opposite value basic data bit field are supplied to opposite value counter 137 via latches 138, 139. A master clock signal from the decompaction control and memory handshaking 54 is supplied to counters 130, 131, 136 and 137 by the code C counter timing control 118 after it has been enabled by the code C initialize 116. The value counter 136 and the opposite value counter 137 have outputs supplied to the code C counter timing control 118 and provide a signal thereto each time a consecutive number of ones or zeros has been shifted out of the output shift registers 52 in accordance with the basic data or opposite value basic data bit fields. In response to "execute code C" signals from the decompaction control and memory handshaking 54, the code C counter timing control provides resets to the value counter 136 and the opposite value counter 137. The latches 138, 139 hold the preset values for subsequent countdowns of counters 136, 137.

The true outputs of the complementary OR gates 122 supplied to the side A multiplexer 64 provide uncompacted "1" data while the complementary outputs supplied to the side B multiplexer 66 provide uncompacted "0" data. The output shift registers 60, 61 are ping-ponged, as described above, by the decompaction control and memory handshaking 54 (FIG. 8) in accordance with "last bit code C" signals generated by the last bit detector 140 whenever the value counters 136, 137 count out. The "data select true*/complement" signal provided to the exclusive OR gate 120 causes the levels in the shift register side to be first shifted out to be the same as the level in first basic data field (bit 3). This signal is essentially a side A, side B shift register coordinating signal which coordinates loading of data from the OR gates 122 into the proper shift register side so that the first data bit shifted corresponds to bit 3 of the code C word.

Figure 7:
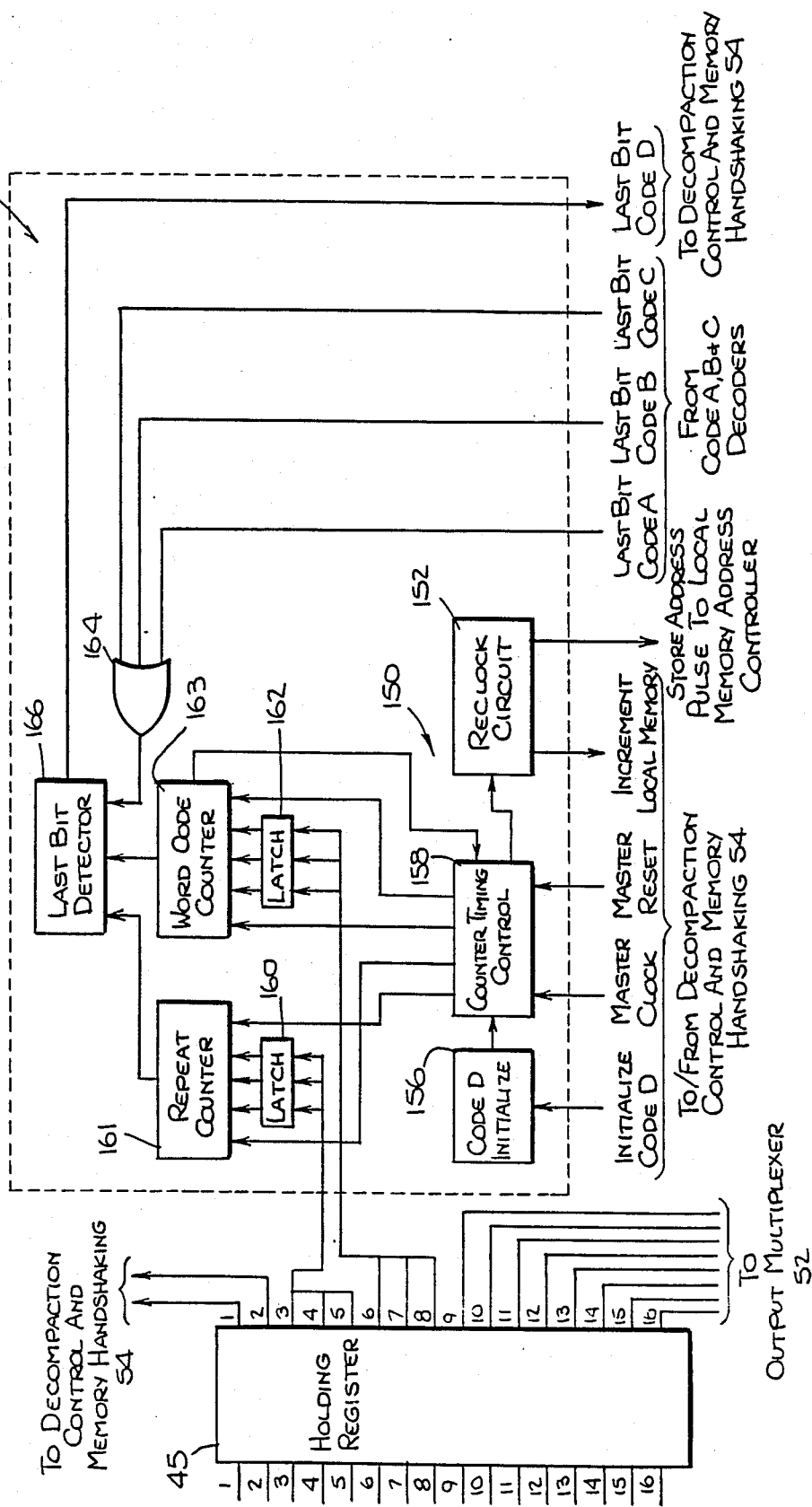
FIG. 7 is a block diagram of the code D decoder of the decompaction module depicted in FIG. 2.

Code D Decoder (FIG. 7)

A code D word specifies sequences of uncompacted data made up of particular code A, code B and/or code C words and can also include absolute data. For example, a code D word could specify a particular code B word to be decompacted and outputted followed by a particular code C word which is then uncompacted and outputted. Code A words can be used to frame uncompacted data in code B and code C words. The code D decoder 49 thus provides looping of complex arrangements of sequenced data.

Referring to FIG. 9, the first two bits of a code D word define the code word identifier field, as in code A, B and C words. Bits 3-5 define a sequence repeat field which specifies the number of times a particular sequence is to be repeated. The sequence is defined by a word number field (bits 6-8) which specifies the number of words to be addressed from the local memory 22 and a basic data field (bits 9-16) comprised of absolute data.

The code D decoder 49 depicted in FIG. 7 includes an initialize/counter timing control section 150, a reclock circuit 152 and a counter/last bit detector section 154. The initialize/counter timing control section 150 includes a code D initialize 156 which receives an "initialize code D" signal from the decompaction control and memory handshaking 54 when bits 1 and 2 of the word held in the holding register 45 have been decoded as a code D word and enables the counter timing control 158.

Bits 3-5 of a code D word defining the sequence repeat field are supplied via a latch 160 to a repeat counter 161 in the counter/last bit detector section 154, and bits 6-8 defining the word number field are supplied via a latch 162 to word code counter 163 also in the counter/last bit detector section 154. An OR gate 164 receives last bit signals for codes A, B and C from decoders A, B and C, respectively. The last bit detector 166 supplies a "last bit code D" output to the decompaction control and memory handshaking 54 when all the uncompacted data of the code A, B and/or C words comprising the code D sequence have been shifted out of the output shift registers 52. The basic data bit filed (bits 9-16) are supplied to the output multiplexer 50 as absolute data.

When enabled, the counter timing control 158 receives the the "master reset" from the decompaction control and memory handshaking 54 and presets the repeat counter 161 with the three bit sequence repeat field and presets the word code counter 163 with the three bit word number field, as well as resetting the reclock circuit 152. The counter timing control 158 also receives the "master clock" from the decompaction control and memory handshaking 54 and couples it to the repeat counter 161 and the word code counter 163. The word code counter 163 outputs a signal to the counter timing control 158 each time a code A, B or C word of the code D sequence has been output by the output shift registers 52 and outputs a signal to the last bit detector 166 when one repitition of the code D sequence has been output by the output shift registers 52. The counter timing control 158 outputs a signal to the reclock circuit 152 each time it receives a signal from the word code counter 163, signifying that a code A, B or C word has been shifted out of the output shift register 52, which causes the reclock circuit to output the "increment local memory signal" to the decompaction control and memory handshaking 54 and the local memory to be incremented.

The reclock circuit 152 also supplies a "store address pulse" to the local memory address controller 33 when the reclock circuit 152 outputs the first "increment local memory signal of the code D sequence. The "store address pulse" causes the address of the local memory of the first code A, B or C word in the code D sequence to be stored so that the code D sequence can be repeated the number of times specified by the sequence repeat field (bits 3-6). The individual words of a code D sequence are stored in adjacent locations in the local memory so that they are read from the local memory in the proper sequence by incrementing the local memory address. At the end of one repetition of a code D sequence, the local memory address is returned to the address of the first word of the code D sequence, which address was caused to be stored by the "store address pulse". After the code D sequence has been repeated the number of times specified in the sequence repeat field, the word code counter 163 outputs a signal to the last bit detector 166 which at the same time receives an output signal from the repeat counter 161 signifying that the sequence was repeated the specified number of times and an output signal from the OR gate 164 signifying that the last word of a code D sequence has been output by the output shift registers 52. In response to these signals, the last bit detector 166 outputs the "last bit code D" signal.

Figure 8:
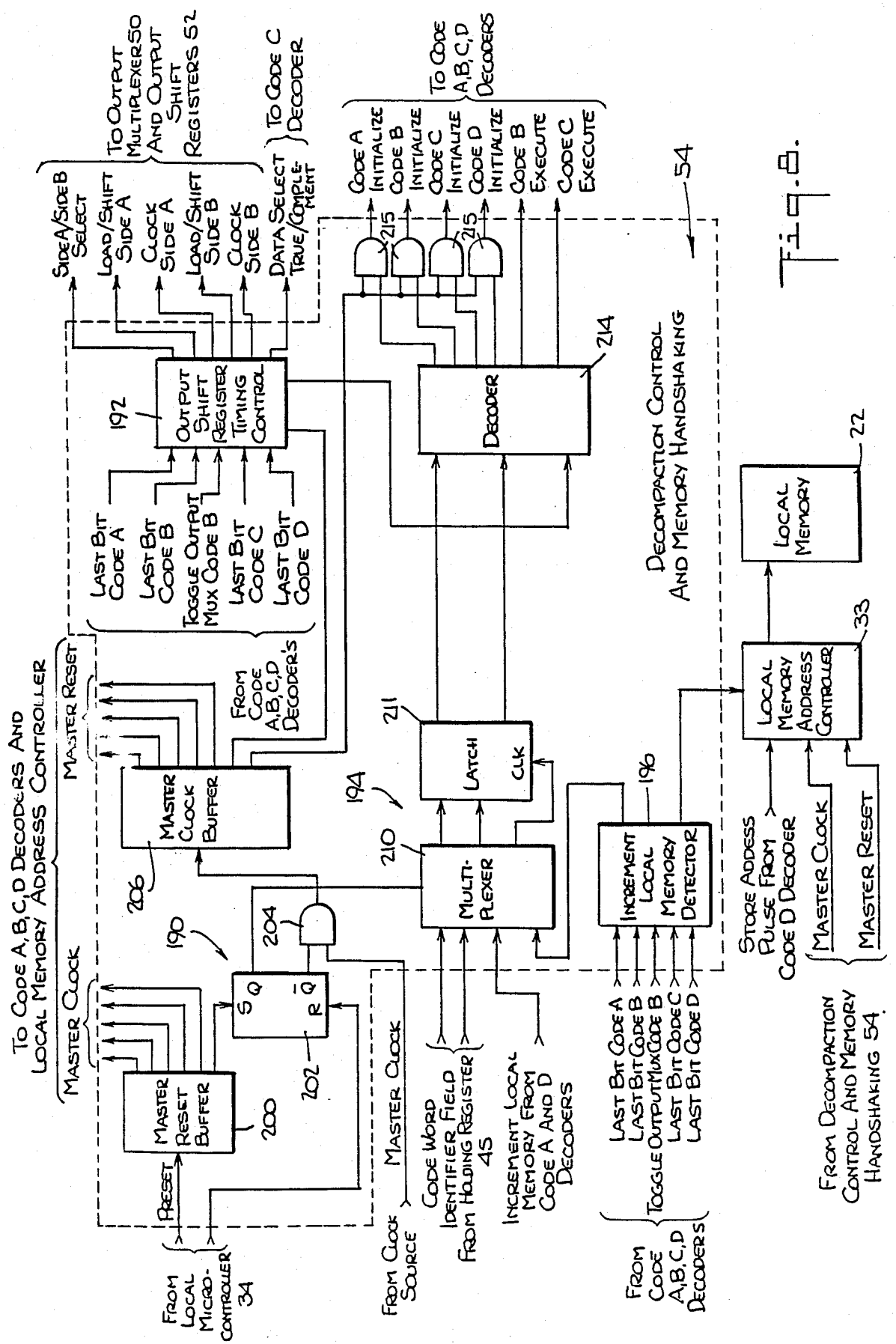
FIG. 8 is a block diagram of the decompaction control and memory hand-shaking of the decompaction module depicted in FIG. 2.

Decompaction Control and Memory Handshaking (FIG. 8)

The decompaction control and memory handshaking 54 depicted in FIG. 8 comprises the control means of the decompaction means and includes reset/clock circuitry 190 which provides the "master reset" and "master clock" signals to the code A, B, C and D decoders 46-49 and the local memory address controller 33, decoding circuitry 192 which controls the operation of the output multiplexer 50 and the output shift registers 52, code word identifier field decoding circuitry 194 which decodes the code word identifier field of the data words read out of the local memory 22 and control circuitry 196 which controls reading of data from the local memory 22.

The reset/clock circuitry 190 includes a master reset buffer 200 which receives a "preset" signal from the local microcontroller 34 and provides the "master reset" signals to the decoders 46-49, the local memory address controller 33 and to the other circuits in the decompaction control and memory handshaking 54. The local microcontroller 34 also supplies an "initialize" signal to flip-flop 202 which enables an AND gate 204 to pass the "master clock" from an external clock source to the master clock buffer 206, which in turn supplies the "master clock" to the different decoders 46-49, the local memory address controller 33 and circuitry in the decompaction control and memory handshaking 54.

The decoding circuitry 192 comprises an output shift register timing control which receives the last bit signals from the code A, B, C and D decoders 46-49, the "toggle output MUX code B" signal from the code B decoder 47, and a clock signal from the master clock buffer 206, and provides the indicated signals to the output multiplexer 50 and the output shift registers 52, except the "data select true*/complement" signal which is supplied to the exclusive OR gate 120 in the code C decoder 48 (FIG. 6).

The code word identifier field decoding circuitry 194 comprises multiplexer 210, latch 211, and decoder 214. The multiplexer 210 receives the two bit code identifier field from the holding register 45 and "increment local memory" signals from the code A and D decoders 46, 49 used in a two word code A sequence and a code D sequence, respectively. The latch 211 receives the two bit code identifier field and a clock signal from the multiplexer 210 each time the multiplexer 210 receives an output from the increment local memory detector 216. At the same time, the contents of the latch 211, as clocked by the multiplexer 210, are supplied to decoder 214. The control circuit 196 comprises an increment local memory detector which provides an output signal to the multiplexer 210 each time it receives a last bit signal from decoders A, B, C and D. The "toggle output MUX code B" signal supplied to the increment local memory detector 216 prevents it from outputting a signal in a code B sequence except at the end of the sequence. The decoder 214 provides initialize signals to AND gates 215 to be clocked to the code A, B, C and D decoders 46-49. The decoder 214 also supplies a "code B execute" signal and a "code C execute" signal to the code B decoder 47 and the code C decoder 48, respectively, in accordance with an input signal received from the output shift register timing control 192. The "execute code C" and execute code B" signals are used to provide signals to the MUX control 96 in the code B decoder 47 and to the counters 136, 137 in the code C decoder, respectively, so that the MUX control 96 in the code B decoder can be toggled and so that the value counter 136 and opposite counter 137 in the code C decoder can be reset.

The increment local memory detector 196 is also coupled to the local memory address controller 33 which causes the local memory address to be incremented each time the increment local memory detector 196 outputs a signal at the end of a code A, B, C or D sequence and after data based on individual code A, B, and C words has been output by the output shaft registers 52 during a code D sequence. The local memory address controller 33 also causes the address of the first code A, B or C word in a code D sequence to be stored in response to the "store address pulse" in a code D sequence.

Overall Operation

The 16 bit holding register 45 is the entry point to the decompaction module 24 for the data from the local memory 22. The requested word from the local memory is retrieved and stored in the decompaction module holding register 45 in conjunction with handshake and request commands from the decompaction control and handshaking 54 which determine when the word should be retrieved. The first operation that is acted upon using the word that is stored in the holding register is the determination of the code in the code word identifier field. Based on the code word identifier field, the appropriate counts or data from the data fields are loaded into the selected code A, B, C or D decoder. Since the minimum word length of uncompacted data is 8 bits for a given word, the retrieve operation takes place within 8 cycles of the actual real time output data. The output shift registers 52 operate at the maximum bit rate since they are in real time operation with the output data sequencing. Hence, it is seen that the algorithms can be individually presented to the output shift registers 52 on a dynamic basis and that the operation of the decompaction module 24 is independent of the operation or the restructuring of the individual data blocks in the various coded algorithm structuring segments. The master clock shifts the data out of the output shift register 52 while the internal clocking of the decompaction module 24 and the handshaking and request signals in the memory address controller 33 are derived from but asynchronous to this master clock. The internal clock structure that handshakes the local memory 22 is asynchronous in the sense that it could correspond to every 8th bit of output data in the case of uncompacted code A data, or it could be a pulse requesting new memory data every 4,000 counts, for example.

The local memory 22 has a sequence of data words that is delivered to the decompaction module 32. A first word is applied to the decompaction module 32 which determines the particular coded algorithm that must be decompacted. Parts of the word held in the holding register 45 are then routed to the decoder specified in the code word identifier field to be acted upon. The specified decoder takes the data and restructures it in uncompacted format to be loaded into the 16 bit output shift registers 52 for application to the UPE output. Meanwhile, the next word is retrieved from the local memory via control signals from the decompaction module 24 which handshakes the local memory address controller 33 while the first coded word is being acted upon. In a sequential manner, this next coded word is decompacted and loaded into the output shift registers 52 to be outputted to the UUT. In sequence, a third word is retrieved from local memory 22 and acted upon. This sequence continues until the completion of the total length of the test execution sequence which determines the total number of bits that are to be applied. Decompaction codes A, B, C and D can be interspersed in any order and in any number of repetitive sequences of any of the individual codes A, B, C and D.

Although the preferred embodiment of the decompaction module 24 is described in connection with data having four compacted data codes and the decompaction module having decoders for decoding the four types of words, the invention is applicable to decoding data from a local memory having two codes, three codes, or more than four codes. In addition, it should be understood that certain circuits can be shared by different decoders and that the decoders can be structured differently than the structures illustrated. Moreover, although decompaction means are described in connection with a UPE, it should be understood that decompaction means can be used with ATE and other equipment for providing binary information from a memory.

Certain changes and modifications of the embodiments of the invention disclosed herein will be readily apparent to those skilled in the art. It is the applicant's intention to cover by the claims all those changes and modifications which could be made to the embodiments of the invention herein chosen for the purpose of disclosure without departing from the spirit and scope of the invention.

What is claimed is:

1. In test equipment for testing a unit under test, decompaction apparatus for decoding N bit parallel binary data words including binary data which is compacted and providing uncompacted serial binary data therefrom to an input of the unit under test, the parallel binary data words including a code identifier field, the decompaction apparatus comprising:
    memory means for storing N bit parallel binary data words;
    a first decoder coupled to receive at least part of an N bit parallel binary data word read from the memory means and selectively capable of being enabled to output alone or with the memory means uncompacted parallel binary data;
    a second decoder coupled to receive at least part of an N bit parallel binary data word read from the memory means and selectively capable of being enabled to output alone or with the memory means uncompacted parallel binary data;
    the uncompacted binary data associated with at least one of the first and second decoders having a greater number of bits than the parallel data stored in the memory means;
    decoding means for receiving the code identifier field of an N bit parallel binary data word read from the memory means, decoding it and causing the decoder specified by the code identifier field to be enabled;
    a multiplexer coupled at least to the first and second decoders to receive parallel uncompacted data associated with the first and second decoders and selectively output received parallel data associated with one of the decoders at a time;
    output means coupled to the multiplexer for receiving parallel uncompacted data therefrom and providing serial uncompacted data to an output of the decompaction apparatus for supply to the input of the unit under test; and
    control means for controlling reading of data from the memory means and operation of the decoding means, the decoders, the multiplexer and the output means.

2. In the test equipment according to claim 1 wherein the multiplexer comprises first and second multiplexers and the output means comprises first and second shift registers, the first multiplexer selectively coupling data associated with the first and second decoders to the first shift register and the second multiplexer selectively coupling data associated with the first and second decoders to the second shift register, the control means alternately causing the first multiplexer to supply uncompacted parallel data associated with one of the first and second decoders to the first shift register and the second multiplexer to supply uncompacted parallel data associated with said one decoder to the second shift register, and alternately causing uncompacted data to be serially shifted to the apparatus output from the shift register that is not receiving data from the first and second multiplexers.

3. The apparatus according to claim 1 wherein the memory means includes an addressable memory for storing the N bit data words and means coupled to the memory means for storing an N bit data word read from the memory.

4. The apparatus according to claim 1 wherein at least one of the first and second decoder means in response to an N bit word stored in the memory means provides parallel data having more than N bits to the multiplexer.

5. The apparatus according to claim 4 wherein the memory means includes a readable memory for storing a plurality of N bit parallel words and means for storing an N bit parallel word read from the memory, and wherein the control means causes N bit words to be read from the memory to the storing means at a given rate and causes serial data to be output by the output means such that the rate at which serial data is output is faster than the given rate at which data is received in the storing means.

6. In the test equipment according to claim 1 wherein the output means comprises output storage means coupled to the multiplexer for temporarily storing uncompacted parallel data associated with the first and second decoders, the control means causing the storage means to serially output the uncompacted data stored therein.

7. In the test equipment according to claim 6 including a third decoder for causing in cooperation with the control means uncompacted parallel data to be generated by at least one of the first and second decoders based on at least one data field in the parallel data word supplied to the third decoder.

8. In the test equipment according to claim 6 wherein the second decoder comprises means for generating when the second decoder is enabled uncompacted binary data of all ones, all zeros or alternating ones and zeros of a selectable length from data contained in a parallel data word.

9. In the test equipment according to claim 6 wherein the first decoder includes means receiving a first part of the data in the parallel data word, and wherein the memory means is coupled to supply a second part of the data in the parallel data word to the multiplexer, the control means causing the multiplexer to couple the second part of the data to the apparatus output when the first decoder is enabled.

10. In the test equipment according to claim 9 wherein the first decoder when enabled causes uncompacted data to be coupled to the multiplexer in response to the first part of the parallel data word.

11. In the test equipment according to claim 6 wherein the second decoder comprises means for generating when the second decoder is enabled uncompacted binary data consisting of at least one fixed pattern of ones and zeros from the data contained in a parallel data word.

12. In the test epuipment according to claim 11 wherein the second decoder includes means for repeating the fixed pattern a number of times specified in a data field of the parallel data word.

13. In automatic test epuipment including a memory configured to store parallel data, and means for accessing parallel data from the memory and supplying data to a unit under test,
a decompaction apparatus for decoding parallel binary data stored in the memory and providing uncompacted serial binary data to the unit under test, the parallel binary data including binary data which is compacted and compaction codes, the decompaction apparatus comprising:
means for storing parallel data read from the memory;
a first decoder coupled to receive at least part of the parallel binary data in the storing means and selectively enablable to output alone or with the storing means uncompacted parallel binary data;
a second decoder coupled to receive at least part of the parallel binary data in the storing means and selectively enablable to output alone or with the storing means uncompacted parallel binary data;
the uncompacted binary data associated with at least one of the first and second decoders having a greater number of bits than the parallel data stored in the storing means;
decoding means for receiving the compaction code of parallel binary data in the storing means, decoding it and causing the decoder specified by the compaction code to be enabled;
a multiplexer coupled at least to the first and second decoders to receive parallel uncompacted data associated with the first and second decoders and selectively output the parallel data associated with one of the decoders at a time;
output means coupled to the multiplexer for receiving parallel uncompacted data therefrom and providing serial uncompacted data on at least one output pin of the apparatus for transmission to the unit under test; and
control means for controlling reading of parallel data from the memory to the storing means and operation of the decoding means the decoders, the multiplexer and the output means.

14. In the automatic test equipment according to claim 13, wherein at least one of the first and second decoders of the decompaction apparatus in response to an N bit parallel word stored in the storing means provides parallel data having more than N bits to the multiplexer.

15. In the automatic test equipment according to claim 13, wherein the control means causes N bit parallel data words to be read from the memory to the storing means at a given rate and causes serial data to be output by the output means such that the rate at which serial data is output is faster than the given rate at which data is received in the storing means.

16. In the automatic test equipment according to claim 13, wherein the output means comprises output storage means coupled to the multiplexer for temporarily storing uncompacted parallel data associated with the first and second decoders, the control means causing the storage means to serially output the uncompacted data stored therein.

17. In the automatic test equipment according to claim 13, wherein the multiplexer comprises first and second multiplexers and the output means comprises first and second shift registers, the first multiplexer selectively coupling data associated with the first and second decoders to the first shift register and the second multiplexer selectively coupling data associated with the first and second decoders to the second shift register, the control means alternately causing the first multiplexer to supply uncompacted parallel data associated with one of the first and second decoders to the first shift register and the second multiplexer to supply uncompacted parallel data associated with said one decoder to the second shift register, and alternately causing uncompacted data to be serially shifted to the apparatus output from the shift register that is not receiving data from the first and second multiplexers.

18. In the automatic test equipment according to claim 13, wherein the second decoder comprises means for generating when the second decoder is enabled uncompacted binary data of all ones, all zeros or alternating ones and zeros of a selectable length from data contained in parallel data stored in the storing means.

19. In the automatic test equipment according to claim 13, wherein the second decoder comprises means for generating when the second decoder is enabled uncompacted binary data consisting of at least one fixed pattern of ones and zeros from data contained in parallel data stored in the storing means.

20. In the automatic test equipment according to claim 13, wherein the second decoder includes means for repeating the fixed pattern a number of times specified in a data field of parallel data stored in the storing means.

21. In the automatic test equipment according to claim 13, including a third decoder for causing in cooperation with the control means uncompacted parallel data to be generated by at least one of the first and second decoders based on at least one data field in the parallel data supplied to the third decoder.

22. In the automatic test equipment according to claim 13, wherein the first decoder includes means receiving a first part of the data in the parallel data stored in the storing means, and wherein the storing means is coupled to supply a second part of the data in the parallel data stored in the storing means to the multiplexer, the control means causing the multiplexer to couple the second part of the data to the apparatus output when the first decoder is enabled.

23. In the automatic test equipment according to claim 22, wherein the first decoder when enabled causes uncompacted data to be coupled to the multiplexer in response to the first part of the parallel data stored in the storing means.

24. In test equipment for testing a unit under test, decompaction apparatus for decoding parallel binary data including compaction codes and binary data which is compacted and providing uncompacted serial binary data therefrom to an input of the unit under test, the decompaction apparatus comprising:
memory means for storing the parallel binary data;
first selectively capable of being enabled decoder means for decoding parallel binary data from the data stored in the memory means and providing alone or with the memory means uncompacted binary data;
second selectively enable decoder means for decoding parallel binary data from the data stored in the memory means and providing alone or with the memory means uncompacted binary data;

the uncompacted binary data associated with at least one of the first and second decoder means having a greater number of bits than the parallel data stored in the memory means;

decoding means for decoding compaction codes and selectively causing at least one of the first and second decoder means to be enabled in accordance therewith;

output means coupled to receive uncompacted binary data associated with the first and second decoder means and to output uncompacted serial binary data on an output of the decompaction apparatus for supply to the input of the unit under test; and control means for controlling reading of parallel binary data from the memory means and operation of the decoder means, the decoding means and the output means.

25. In the test equipment according to claim 22 wherein the output means comprises means for temporarily storing the uncompacted data it receives.

26. In the test equipment according to claim 24 including first and second multiplexer means coupled at least to the first and second decoder means and to the output means, and wherein the output means comprises first and second output storage means, the first multiplexer means selectively supplying parallel uncompacted data associated with the first and second decoder means to the first output storage means and the second multiplexer means selectively supplying parallel uncompacted data associated with the first and second decoder means to the second output storage means, the first and second output storage means temporarily storing parallel uncompacted data therein, the control means alternately causing the first multiplexer means to supply the data associated with one of the first and second decoder means to the first output storage means and the second multiplexer means to supply the data associated with said one decoder means to the second output storage means, and to alternately cause the data stored in the first and second output storage means that is not receiving data from the first and second multiplexer means to be serially outputted on the decompaction apparatus output.

27. In the test equipment according to claim 24 including third decoder means for causing in cooperation with the control means uncompacted data to be generated by at least one of the first and second decoder means based on data in the parallel data supplied to the third decoder means.

28. In the test equipment according to claim 24 wherein the memory means includes an addressable memory for storing N bit data words and means coupled to the memory means for storing an N bit data word read from the memory.

29. In the test equipment according to claim 24 wherein at least one of the first decoder means and the memory means provides uncompacted parallel data to the output means when the first decoder means is enabled, and wherein the second decoder means provides uncompacted parallel data to the output means when the second decoder means is enabled, the control means causing the parallel uncompacted data to be supplied to the output means and the output means to serially output the uncompacted data on the decompaction apparatus output.

30. In the test equipment according to claim 24 wherein the memory means includes means for storing N bit parallel data, the apparatus including means for supplying N bit parallel data to the storing means at a given rate, wherein the control means causes serial data to be output by the output means such that the rate at which serial data is output is faster than the given rate at which N bit parallel data is received in the storing means.

31. In the test equipment according to claim 30 wherein the second decoder means comprises means for generating from the parallel data uncompacted binary data of all ones, all zeros or alternating ones and zeros of a selectable length exceeding the length of the parallel data stored in the storing means.

32. In the test equipment according to claim 30 wherein the first decoder means includes means receiving a first part of the data in the parallel data, and wherein the memory means is coupled to the output means and supplies a second part of the data in the parallel data thereto, the control means causing the output means to couple the second part of the data to the decompaction apparatus output when the first decoder means is selectively enabled.

33. In the test equipment according to claim 32 wherein the first decoder means when enabled causes uncompacted data to be coupled to the output means in response to the first part of the data.

34. In the test equipment according to claim 30 wherein the second decoder means comprises means for generating from the parallel data uncompacted binary data consisting of at least one fixed pattern of ones and zeros exceeding the length of the parallel data stored in the storing means.

35. In the test equipment according to claim 34 wherein the second decoder means includes means for repeating the fixed pattern a number of times in accordance with data contained in the parallel data supplied to the second decoder means.

* * * * *